US006380040B1

(12) United States Patent
Kepler et al.

(10) Patent No.: US 6,380,040 B1
(45) Date of Patent: Apr. 30, 2002

(54) PREVENTION OF DOPANT OUT-DIFFUSION DURING SILICIDATION AND JUNCTION FORMATION

(75) Inventors: Nick Kepler, Saratoga, CA (US); Karsten Wieczorek, Reichenberg-Boxdorf (DE); Larry Wang, San Jose, CA (US); Paul R. Besser, Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/629,883

(22) Filed: Aug. 1, 2000

Related U.S. Application Data
(60) Provisional application No. 60/146,343, filed on Aug. 2, 1999.

(51) Int. Cl.[7] .............................................. H01L 21/386
(52) U.S. Cl. ...................... 438/301; 438/558; 438/559; 438/563; 438/664; 438/682
(58) Field of Search ................................. 438/542, 558, 438/559, 563, 664, 682, 301, 220, 582, 581

(56) References Cited

U.S. PATENT DOCUMENTS

| | | |
|---|---|---|
| 4,378,628 A | 4/1983 | Levinstein et al. |
| 4,558,507 A | 12/1985 | Okabayashi et al. |
| 5,217,924 A | 6/1993 | Rodder et al. |
| 5,352,631 A | 10/1994 | Sitaram et al. |
| 5,420,058 A | 5/1995 | Lee et al. |
| 5,478,776 A | 12/1995 | Luftman et al. |
| 5,529,958 A | 6/1996 | Yaoita |
| 5,550,084 A | 8/1996 | Anjum et al. |
| 5,569,624 A | 10/1996 | Weiner |
| 5,576,244 A | 11/1996 | Hayashi et al. |
| 5,770,490 A | 6/1998 | Frenette et al. |
| 5,818,550 A | 10/1998 | Kadota et al. |
| 5,899,720 A | 5/1999 | Mikagi |
| 5,899,741 A | 5/1999 | Tseng et al. |
| 5,908,309 A | 6/1999 | Andoh |
| 5,930,617 A | 7/1999 | Wu |
| 5,933,740 A | 8/1999 | Chapman |
| 5,970,370 A | 10/1999 | Besser et al. |

(List continued on next page.)

OTHER PUBLICATIONS

Materials and Bulk Processes, "Doping Technologies," The National Technology Roadmap for Semiconductors (1994), pp. 118–121.

H. Jiang, et al., "Ultra Shallow Junction Formation Using Diffusion from Silicides," J. Electrochem. Soc., vol. 139, No. 1, Jan. 1992, pp. 196–218.

La Via, et al., "Boron Diffusion in Co74Ti26 Amorphous Alloy," Appl. Phys. Letters, vol. 60, Issue 6, pp. 701–703 (Feb. 10, 1992).

(List continued on next page.)

*Primary Examiner*—Long Pham
(74) *Attorney, Agent, or Firm*—McDermott, Will & Emery

(57) ABSTRACT

High integrity cobalt silicide contacts are formed with shallow source/drain junctions. Embodiments include depositing a layer of cobalt on a substrate above intended source/drain regions, followed by silicidation and diffusing impurities from a doped film during or after silicidation in an environment which discourages out-diffusion of the impurities to the environment. The resulting source/drain junctions are self-aligned to the cobalt silicide/silicon substrate interface, thereby preventing junction leakage while advantageously enabling forming the cobalt silicide contacts at optimum thickness to avoid parasitic series resistances. The formation of self-aligned source/drain junctions to the cobalt silicide/silicon substrate interface facilitates reliable device scaling, while the avoidance of unwanted diffusion of impurities to the environment assures adequate doping of the source/drain regions.

20 Claims, 9 Drawing Sheets

U.S. PATENT DOCUMENTS

| | | | |
|---|---|---|---|
| 5,980,265 | A | 11/1999 | Tischler |
| 5,981,372 | A | 11/1999 | Goto et al. |
| 5,985,768 | A | 11/1999 | Speranza et al. |
| 5,989,996 | A | 11/1999 | Kishi |
| 5,994,176 | A | 11/1999 | Wu |
| 5,998,271 | A | 12/1999 | Schwalke |
| 6,025,242 | A | 2/2000 | Ma et al. |
| 6,057,220 | A | 5/2000 | Ajmera et al. |
| 6,096,599 | A | 8/2000 | Kepler et al. |
| 6,169,005 | B1 * | 1/2001 | Kepler et al. ............... 438/301 |

OTHER PUBLICATIONS

Kim et al., "Effect of Ti–Capping Thickness on the Formation of an Oxide–Interlayer–Mediated–Epitaxial CoSi2 Film by *Ex Situ* Annealing," Journ. Appl. Phys., vol. 85, No. 3, pp. 1503. (Feb. 1, 1999).

Kim et al, "Interfacial Reaction and Formation Mechanism of Epitaxial CoSi2 by Rapid Thermal Annealing in Co/Ti/Si(100) System," Journ. Appl. Phys. vol. 82, No. 5, pp. 2323 (Sep. 1, 1997).

* cited by examiner

PREVENTION OF DOPANT OUT-DIFFUSION DURING SILICIDATION AND JUNCTION FORMATION

RELATED APPLICATIONS

This application claims priority from U.S. Provisional Application Ser. No. 60/146,343, filed Aug. 2, 1999, incorporated herein by reference.

FIELD OF THE INVENTION

The present invention relates to a method of manufacturing a semiconductor device comprising refractory metal silicide contacts to source/drain and silicon gate regions. The present invention has particular applicability in manufacturing reliable high density semiconductor devices with submicron design features, shallow junction depths and cobalt silicide contacts to source/drain regions.

BACKGROUND ART

Current demands for high density and performance associated with ultra large scale integration require design rules of about 0.18 microns and under, increased transistor and circuit speeds and improved reliability. As device scaling plunges into the deep sub-micron ranges, it becomes increasingly difficult to maintain performance and reliability.

In the manufacture of conventional complementary metal oxide semiconductor (CMOS) devices, referring to FIG. 1A, isolation regions 110, called field oxide regions, are formed in a semiconductor substrate 100 of silicon dioxide by local oxidation of silicon (LOCOS) or by shallow trench isolation (STI). A conductive gate 130, such as polysilicon, is also formed on substrate 100, with a gate oxide layer 120 in between. Dielectric spacers 140 are formed on sidewalls of the gate 130, and source/drain regions 150 are formed on either side of gate 130 by implantation of impurities.

As gate lengths are reduced to below 0.5 $\mu$, refractory metal silicide layers, such as titanium silicide, are typically formed over source/drain regions 150 and gate 130 to reduce the sheet resistivity of these components, thereby improving device performance. Referring to FIG. 1B, a titanium layer 160 is deposited, as by sputtering, over the entire substrate 100 as well as field oxide 110, gate 130 and spacers 140. A low temperature rapid thermal anneal (RTA) reaction creates a first-phase titanium silicide (C49) on the exposed silicon of gate 130 and source/drain regions 150. The unreacted titanium over field oxide 110 and spacers 140 is then removed, and a high temperature RTA reaction changes the first-phase titanium silicide into a low-resistivity second-phase titanium silicide 170 (C54), as shown in FIG. 1C. Since the titanium silicide does not form on field oxide 110 or spacers 140, it is self-aligned to the gate 130 and source/drain regions 150. Hence, the titanium silicide formed in this process is known as "titanium salicide" (self-aligned silicide).

Titanium salicide is effective in decreasing sheet resistivity if the gate length is greater than about 0.25 $\mu$. At a gate length of about 0.25 $\mu$ the titanium silicide sheet resistance rises dramatically due to narrow-line effects; that is, the low-resistivity silicide C54 does not completely form because first-phase C49 grains are very large (about 0.5 $\mu$), and hence it is not possible to fit enough grains on the gate to nucleate and grow a sufficient amount of C54.

To maintain low sheet resistance as gate lengths are decreased in scale below about 0.25 $\mu$, cobalt is typically used instead of titanium in silicide formation. Cobalt silicide does not display the undesirable narrow-line effects of titanium silicide because the conversion from its first-phase cobalt silicide to its low-resistivity second-phase cobalt silicide is a diffusion reaction, rather than the nucleation and growth reaction of titanium silicide, and therefore the relationship of grain size to gate size is not a limiting factor.

However, the cobalt salicide process has a drawback in that cobalt silicide is more likely than titanium silicide to cause source and drain junction leakage, which can result in unacceptably high power dissipation as well as functional failure. This problem becomes especially critical as gate lengths are scaled below 0.25 $\mu$, and source and drain junctions are typically made shallower to prevent transistor short-channel effects. Since shallow junctions are more susceptible to junction leakage than deep junctions, cobalt silicide related junction leakage effectively limits CMOS device scaling.

A cause of this junction leakage, referring to FIG. 2, is the unevenness of the interface between the cobalt silicide 210 and the silicon source/drain regions 220, which results in an insufficient distance between portions of the bottom of the cobalt silicide 210 and source/drain junctions 220a. When a junction 220a is biased, a depletion region (i.e., an area depleted of free carriers) is formed which extends on either side of the junction 220a. Since the distance the depletion region spreads from the junction 220a is inversely proportional to the doping of the region, and source/drain region 220 is more heavily doped than substrate 200, the depletion region spreads mainly into substrate 200. Nevertheless, if cobalt silicide 210 extends into the depletion spread, leakage can occur as carriers are swept across this highly charged region.

Junction leakage also occurs due to consumption of silicon of substrate 200 during silicide formation. For example, when cobalt silicide is formed to a given thickness, a thickness of substrate silicon slightly greater than the thickness of the silicide is consumed. As junctions become shallower with device scaling, consumption of substrate silicon during silicidation results in an insufficient distance between portions of the bottom of the cobalt silicide 210 and source/drain junctions 220a and, hence, junction leakage. Junction integrity can be maintained by providing a large enough distance between junction 220a and the interface of silicide 210 and source/drain region 220; i.e., by reducing the thickness of cobalt silicide 210. However, reducing its thickness increases the sheet resistivity of cobalt silicide 210, thus reducing its effectiveness.

Copending U.S. patent application Ser. No. 09/187,427 and U.S. Pat. No. 6,096,399 disclose methodologies for forming junctions self-aligned to the bottom of the cobalt silicide, thus avoiding junction leakage by addressing the problem of insufficient distance between portions of the bottom of the silicide and the source/drain junctions. According to these methodologies, a doped film is deposited on top of the cobalt or cobalt silicide, from which impurities are diffused through the cobalt silicide to form source/drain regions having a junction depth which is substantially evenly spaced from the metal silicide/silicon interface.

Copending U.S. patent application Ser. No. 09/318,824 addresses the problem of substrate silicon consumption during silicidation, facilitating the formation of shallower source/drain junctions demanded as devices are further scaled. According to this methodology, a doped amorphous silicon film is deposited on top of the cobalt. The amorphous silicon film is consumed during silicidation, thereby decreasing the amount of substrate silicon consumed, and the dopant is diffused through the cobalt silicide to form source/drain regions having ultra-shallow junctions substantially evenly spaced from the metal silicide/silicon interface.

Disadvantageously, when implementing the methodologies of U.S. Pat. No. 6,096,599 and copending applications Ser. Nos. 09/187,427 and 09/318,824, the impurities may diffuse, upon heating, out of the doped film and into the environment rather than into the substrate. This may occur whether the diffusion step is carried out at the low temperature RTA step, the high temperature RTA step, or at a separate heating step. As a result of unwanted out-diffusion, the amount of impurities available to dope the substrate may be insufficient to properly form the source/drain regions.

There exists a need for a method of manufacturing a semiconductor device by diffusing impurities from a doped layer into the substrate during or after silicidation to form source/drain regions, without a loss of dopant due to out-diffusion of impurities to the environment.

SUMMARY OF THE INVENTION

An advantage of the present invention is a method of manufacturing a semiconductor device having source/drain regions formed by diffusion of impurities from a doped layer during or after silicidation which avoids out-diffusion of impurities from the doped layer to the environment.

Additional advantages and other features of the present invention will be set forth in part in the description which follows and in part will become apparent to those having ordinary skill in the art upon examination of the following or may be learned from the practice of the present invention. The advantages of the present invention may be realized and obtained as particularly pointed out in the appended claims.

According to the present invention, the foregoing and other advantages are achieved in part by a method of manufacturing a semiconductor device, which method comprises forming a metal layer on a main surface of a semiconductor substrate containing silicon;

heating to form a layer of metal silicide; forming a doped layer having impurities on the metal layer or the metal silicide layer; and heating to diffuse the impurities into the substrate to form source/drain regions having a junction depth below the metal silicide layer, in an environment that substantially prevents out-diffusion of the impurities from the doped layer to the environment.

Additional advantages of the present invention will become readily apparent to those skilled in this art from the following detailed description, wherein only the preferred embodiment of the present invention is shown and described, simply by way of illustration of the best mode contemplated for carrying out the present invention. As will be realized, the present invention is capable of other and different embodiments, and its several details are capable of modifications in various obvious respects, all without departing from the present invention. Accordingly, the drawings and description are to be regarded as illustrative in nature, and not as restrictive.

BRIEF DESCRIPTION OF THE DRAWINGS

Reference is made to the attached drawings, wherein elements having the same reference numeral designations represent like elements throughout, and wherein.

DESCRIPTION OF THE INVENTION

Figure 1A:
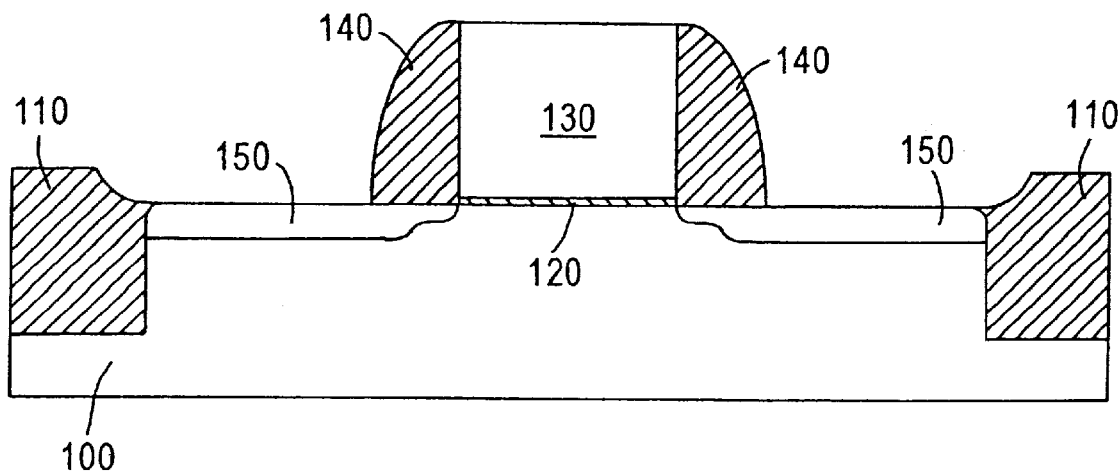
FIGS. 1A–1C schematically illustrate sequential phases of a conventional salicide technique.
Figure 1B:
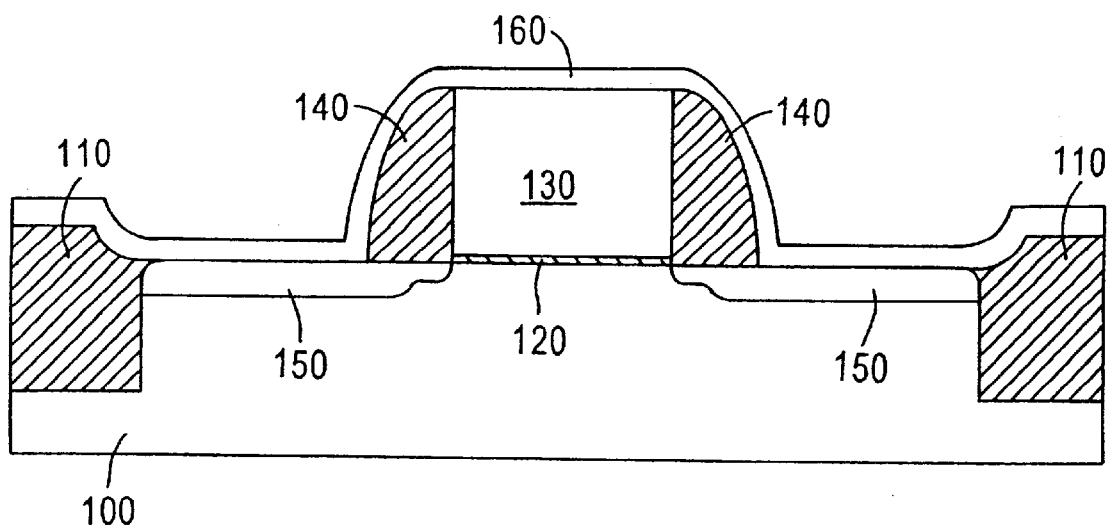
Figure 1C:
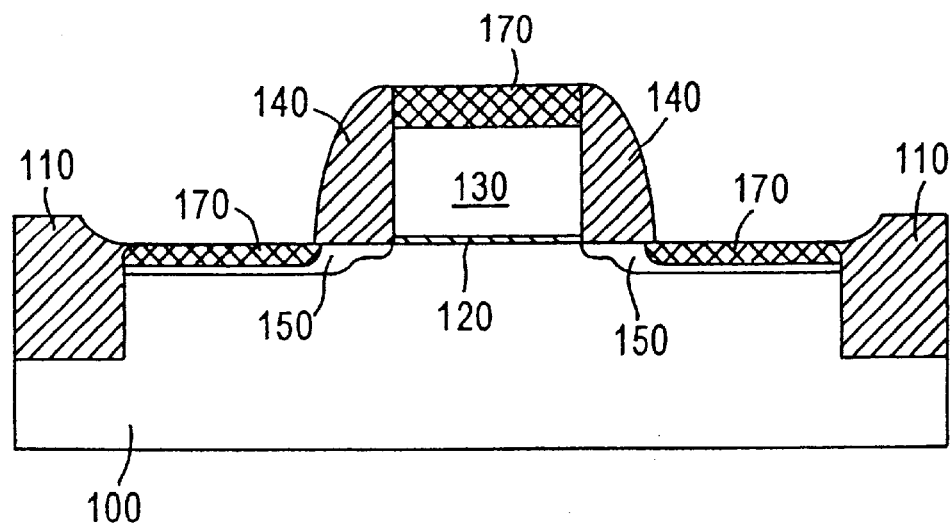
Figure 2:
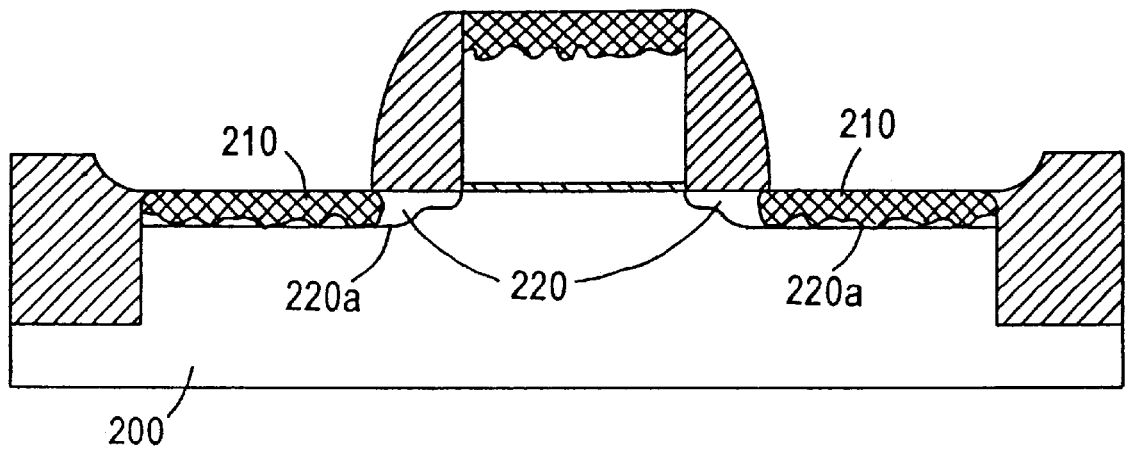
FIG. 2 depicts the results of a conventional method of cobalt salicide formation.

When employing the methodologies of U.S. Pat. No. 6,096,599 and copending U.S. patent applications Ser. No. 09/187,427 and Ser. No. 09/318,824 to form source/drain regions by diffusing impurities from a doped layer into the substrate during or after silicidation, the impurities may diffuse out of the doped film away from the substrate and into the ambient, resulting in insufficient doping of the substrate. The present invention addresses and solves problems stemming from unwanted out-diffusion of impurities into the environment, thereby ensuring the formation of adequately doped source/drain regions.

According to the methodology of the present invention, a layer of metal, e.g., cobalt, is deposited on a substrate before forming the source/drain implants, i.e., above intended source/drain regions, field oxide regions, gates and spacers. As used throughout the present disclosure and claims, the term "substrate" denotes a semiconductor substrate or an epitaxial layer formed on the semiconductor substrate. A two-step silicidation process is then carried out, as by RTA, as described in U.S. Pat. No. 6,096,599 and copending applications Ser. No. 09/187,427 and Ser. No. 09/318,824, wherein a doped film is deposited on either the cobalt layer, the high resistivity first-phase cobalt silicide, or the low-resistivity second-phase cobalt silicide so that the dopants diffuse through the silicide into the substrate when heated to form source/drain regions having a junction depth which is substantially evenly spaced from the metal silicide/silicon interface. However, the heating step in which impurities from the doped film are to diffuse out of the doped film and towards the substrate; i.e., the high- or low-temperature RTA or a separate heating step, is performed in an environment that substantially prevents out-diffusion of the impurities to the environment.

In one embodiment of the present invention, the environment is saturated with a species of the impurities, thus creating a high concentration of impurities at the top surface of the doped film. Since dopants tend to diffuse from areas of high concentration to areas of low concentration, the presence of a high concentration of impurities in the environment will cause the impurities in the doped film to tend to diffuse towards the substrate, thereby minimizing unwanted out-diffusion of impurities into the environment, and ensuring the formation of adequately doped source/drain regions.

In another embodiment of the present invention, the diffusion step is carried out in an inert gas atmosphere, such as nitrogen or argon, maintained at a pressure of about 770 Torr. The pressure substantially prevents the impurities from diffusing upward and out of the doped film into the environment, thereby minimizing losses of impurities to the environment.

In all embodiments of the present invention, the impurities, which gain mobility when the doped film is heated, readily diffuse out of the doped film and diffuse through the cobalt silicide into the substrate, as cobalt silicide does not have as great an affinity for dopants as the substrate silicon. Due to the high diffusivity of the impurities in the cobalt silicide, the impurities form a shallow source/drain junction self-aligned to the cobalt silicide/silicon interface, thus avoiding junction leakage independently of the interface shape and the cobalt silicide thickness.

Figure 3A:
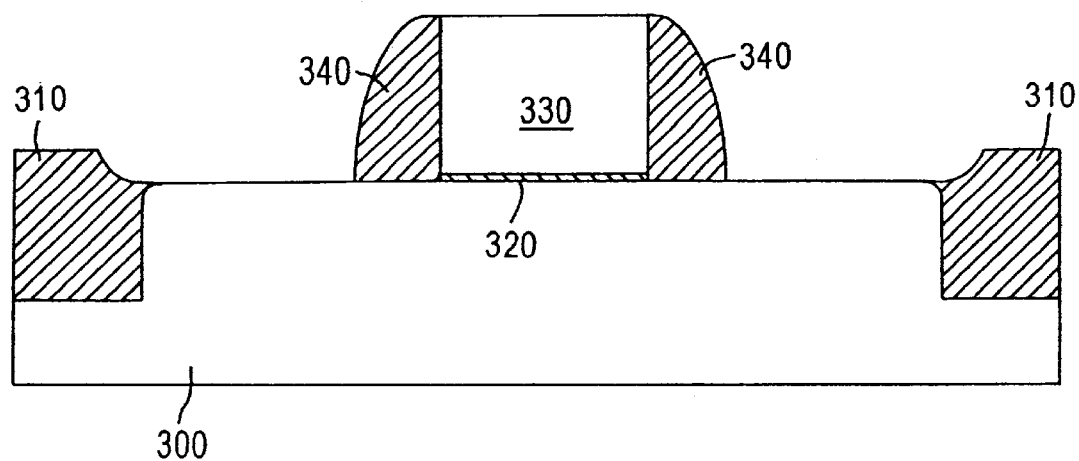
FIGS. 3A–3H schematically illustrate sequential phases of a method in accordance with an embodiment of the present invention.

An embodiment of the present invention is illustrated in FIGS. 3A–3G. As shown in FIG. 3A, field oxide regions 310 are formed on substrate 300, as by LOCOS or STI, followed by a thermally grown gate oxide layer 320 and a polysilicon gate 330, typically by low pressure chemical vapor deposition (LPCVD), masking and etching. Dielectric spacers 340 are thereafter formed on sidewalls of gate 330, such as silicon dioxide LPCVD and anisotropically etched.

Figure 3B:
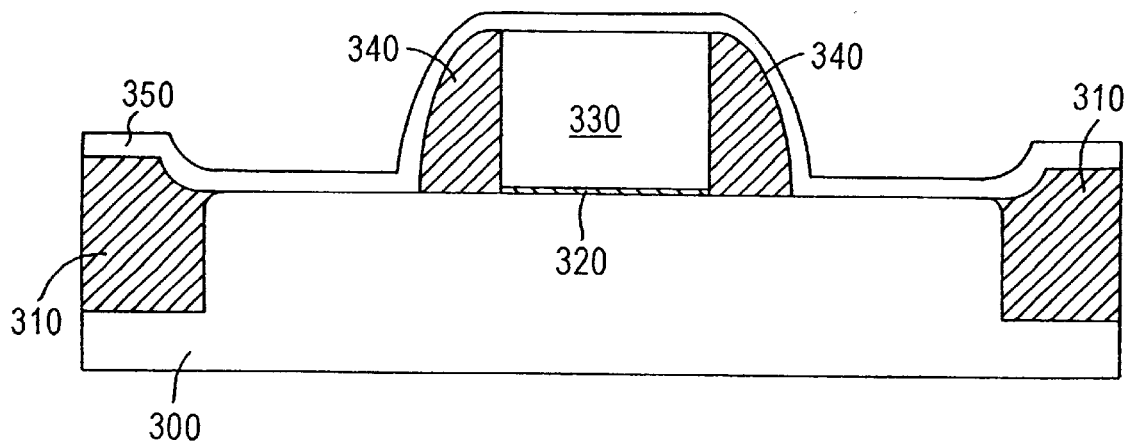
Figure 3C:
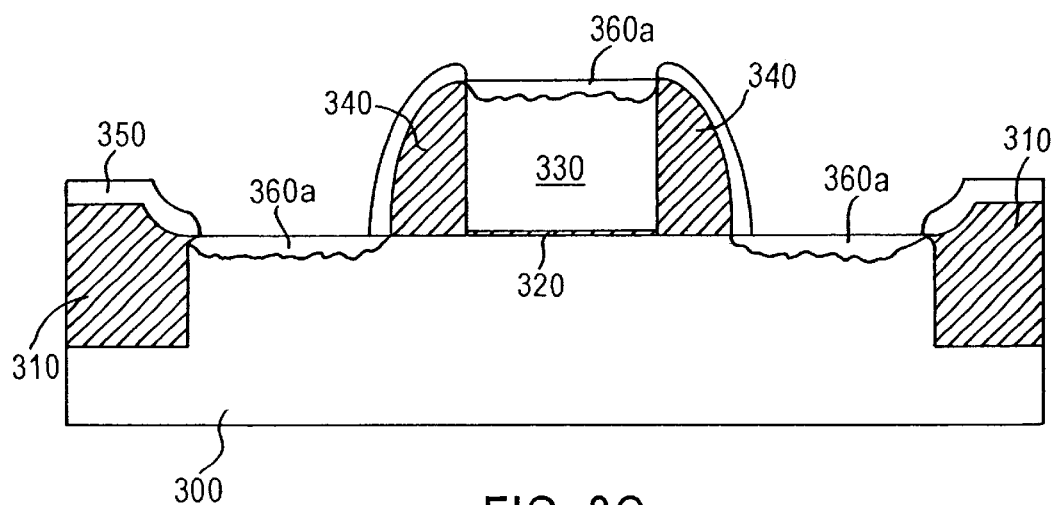

Referring to FIG. 3B, a layer of cobalt 350 is deposited across substrate 300, including field oxide regions 310, spacers 340 and gate 330, as by sputtering. Next, referring to FIG. 3C, a low temperature RTA is performed at about 400° C. to about 600° C.; e.g., about 470° C., to cause portions of cobalt layer 350 above the silicon of gate 330 and substrate 300 to react and form a high resistivity first phase cobalt silicide 360a. Portions of cobalt layer 350 above field oxide regions 310 and dielectric spacers 340 do not react to form a silicide, so cobalt siuicide 360a is self-aligned to gate 330 and the intended source/drain regions of substrate 300. Thereafter, the unreacted portions of cobalt layer 350 above field oxide regions 310 and spacers 340 are stripped away, as by wet etching.

Figure 3D:
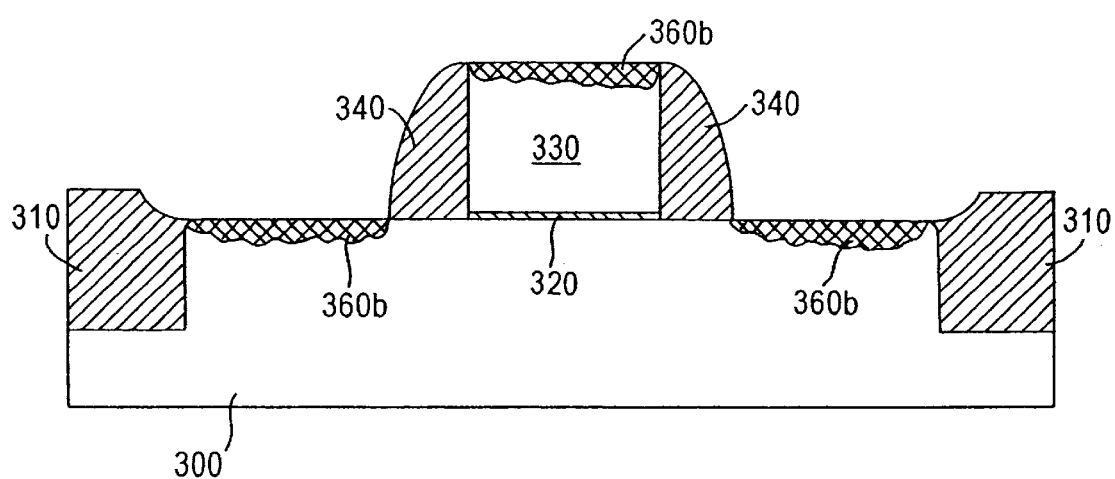
Figure 3E:
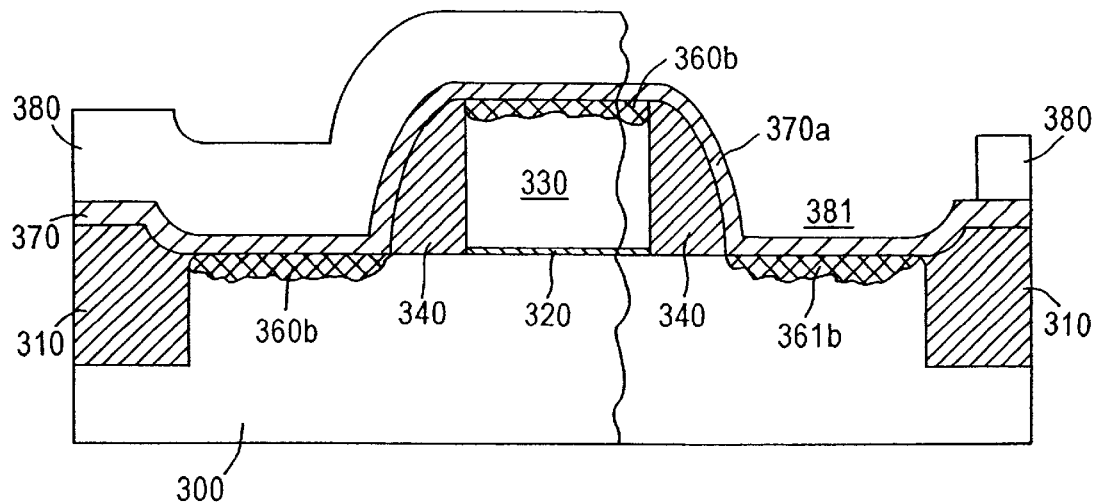

A high-temperature RTA is next performed at about 700° C. to about 900° C.; e.g., about 825° C., to convert high resistivity phase cobalt silicide 360a into a low-resistivity second phase cobalt silicide 360b (see FIG. 3D). A first doped film 370 is then deposited on cobalt silicide 360b, as by LPCVD (see FIG. 3E). First doped film 370 is doped with a first conductivity type of impurities, either n-type impurities such as phosphorus or arsenic, or P-type impurities such as boron or indium, which will subsequently dope substrate 300 to form source/drain regions having ultra-shallow junctions. First doped film 370 is formed of a material which allows the impurities to diffuse out, and should be a dielectric if it is not to be stripped off after diffusion of the impurities. Suitable materials include silicon dioxide, silicon oxynitride or silicon nitride.

Figure 3F:
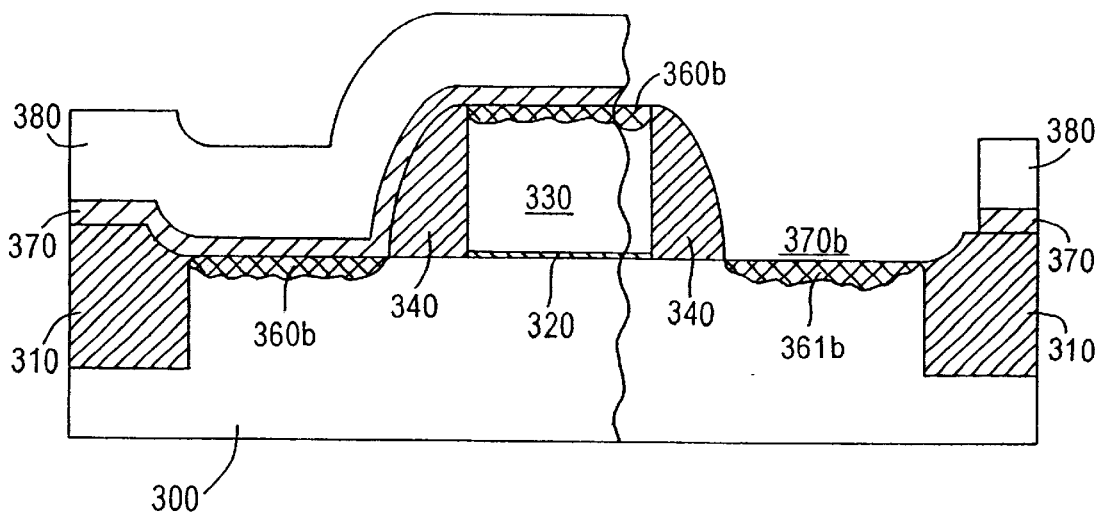
Figure 3G:
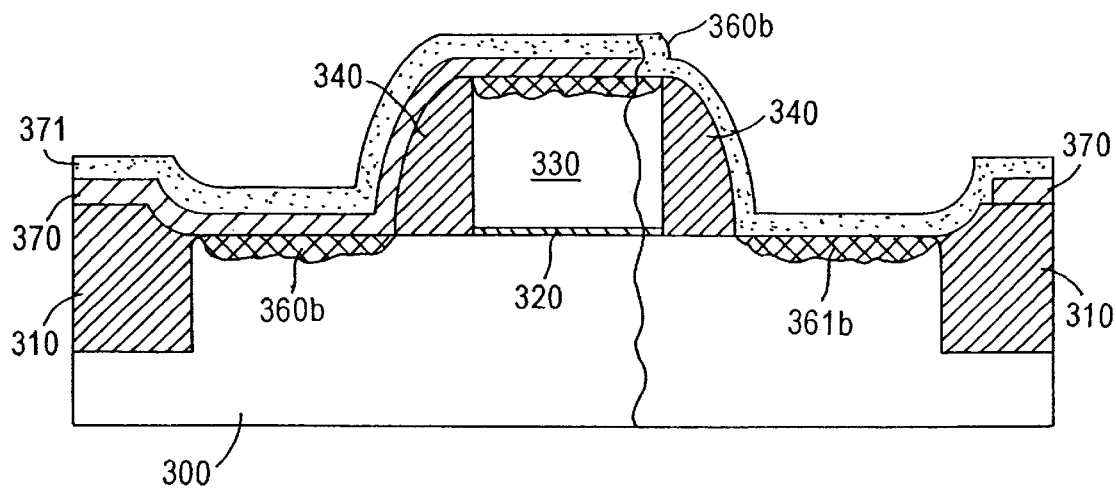

A photoresist mask 380 is formed on first doped film 370, and has openings 381 to expose portions 370a of first doped film 370 corresponding to selected portions 361a of region 360b which are not to receive dopant from first doped film 370. First doped film 370 is then etched, as depicted in FIG. 3F, to form through-holes 370b in first doped film 370, thus exposing selected portions 361b of region 360b, and a second doped film 371 is deposited over selected portions 361b and over first doped film 370, as depicted in FIG. 3G. Second doped film 371 is doped with a second conductivity type of impurities different than the first impurity type of first doped film 370, and like first doped film 370 can be silicon dioxide, silicon oxynitride or silicon nitride, deposited as by LPCVD, contain impurities such as boron, arsenic, antimony, phosphorus, or indium depending on its impurity type, and must be a dielectric if it is to remain on the device after diffusion of the impurities.

Figure 3H:
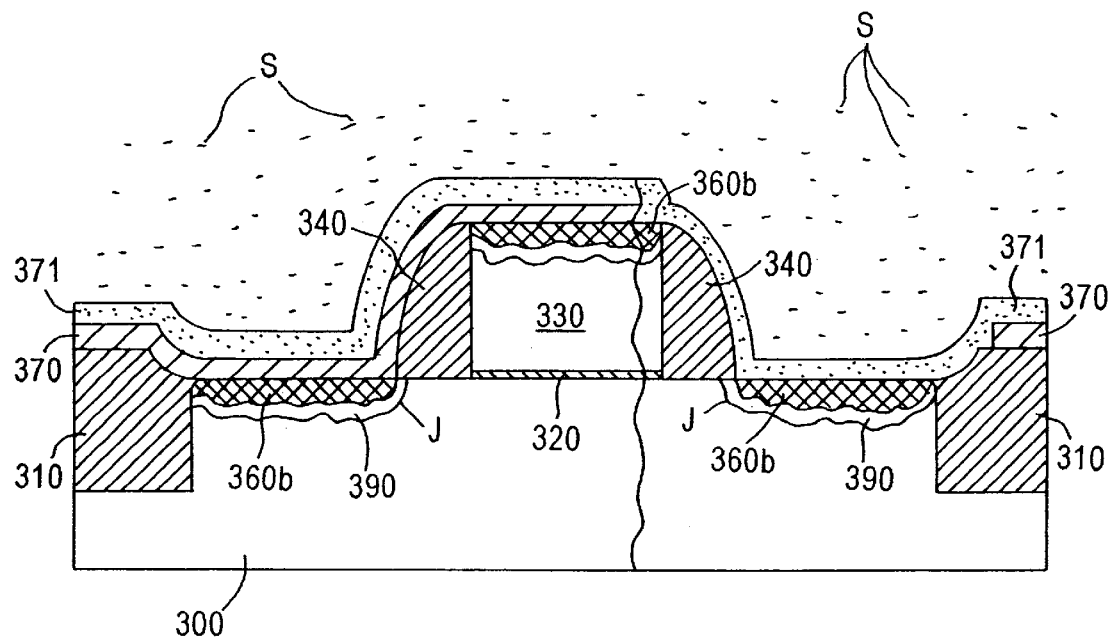

Thereafter, as depicted in FIG. 3H, a heating step is carried out in an environment saturated with a species S of the second conductivity type of impurities of doped film 371. For example, if the second conductivity type of impurities is phosphorus, species S is phosphene; if the second conductivity type of impurities is arsenic, species S is arsene. Likewise, species S may also be boron fluoride, antimony or indium depending on the second conductivity type of impurities.

The heating step is performed at a temperature such that the stability of cobalt silicide 360b is maintained. At temperatures about 950° C., unwanted agglomeration occurs in cobalt silicide. Therefore, the heating step is carried out at about 850° C. to about 950° C. for about 10 seconds to about 60 seconds; e.g., about 925° C. for about 10–60 seconds.

The heating step diffuses impurities out of first and second doped films 370, 371, through cobalt silicide 360b and into gate 330 and substrate 300 to form source/drain regions 390 below cobalt silicide 360b and to form shallow junctions J at a depth of about 2000 Å or less; e.g., about 500 Å. Because the impurities readily diffuse through the cobalt silicide 360b, junctions J are self-aligned to the cobalt silicide/silicon interface and substantially equidistant therefrom; i.e., the shape of junctions J substantially correspond to the shape of the bottom of cobalt silicide 360b, thus assuring a sufficient distance between the bottom of cobalt silicide 360b and junction J to avoid junction leakage, regardless of the interface shape and the thickness of cobalt silicide 360b. Moreover, because species S saturates the environment in which the diffusion step is carried out with a species of the second conductivity type of impurities, impurities do not out-diffuse from second doped film 371 into the environment, but rather diffuse towards substrate 300, thereby ensuring the formation of adequately doped source/drain regions 390.

In another embodiment of the present invention, instead of the environment being saturated by species S, the heating step leading to formation of source/drain regions 390 and junctions J may be carried out in an inert gas atmosphere maintained at a pressure of about 770 Torr; e.g., an atmosphere of nitrogen or argon at about 770 Torr. The elevated pressure prevents impurities from diffusing upward and out of second doped film 371 into the environment, thereby minimizing losses of impurities to the environment.

Each of the first doped film 370 and the second doped film 371 have an impurity concentration great enough to form junctions J; i.e., an impurity concentration of about $1 \times 10^{21}$ $cm^{-3}$ to about $2 \times 10^{21}$ $cm^{-3}$.

Second doped film 371 partially overlays first doped film 370, as depicted in FIGS. 3G and 3H; however, the second conductivity type of impurities, initially carried by second doped film 371, should not be allowed to diffuse through the first doped film 370 (during the low temperature RTA) and counter-dope source/drain regions 390. Several methods for preventing such unwanted diffusion are disclosed in, for example, copending application Ser. No. 09/187,427, which is hereby incorporated by reference.

Figure 4A:
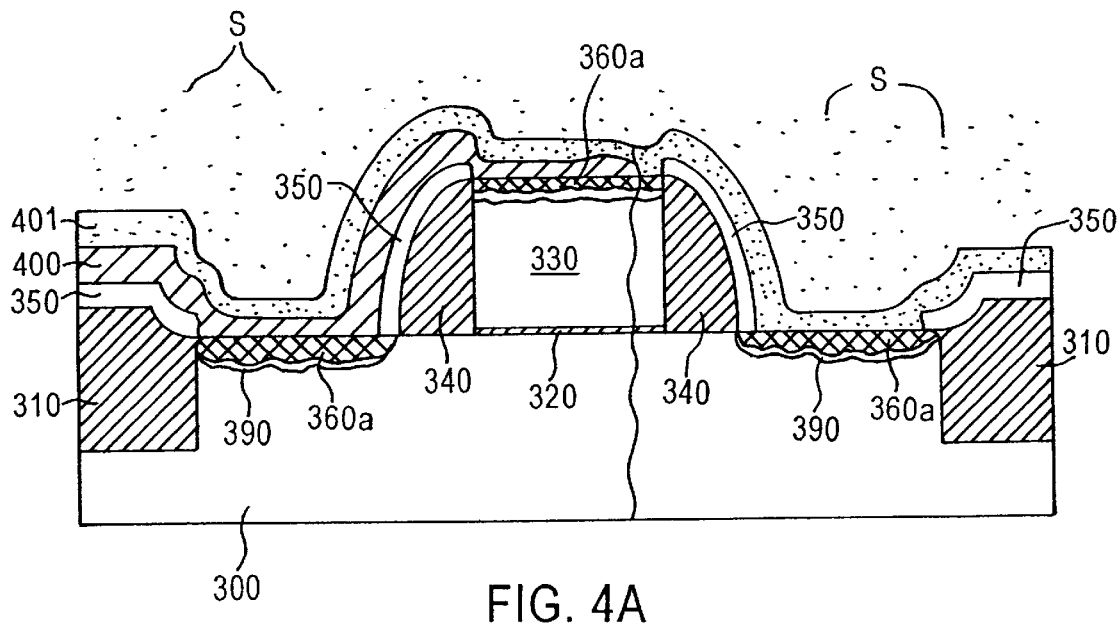
FIGS. 4A–4B schematically illustrate sequential phases of a method in accordance with another embodiment of the present invention.
Figure 4B:
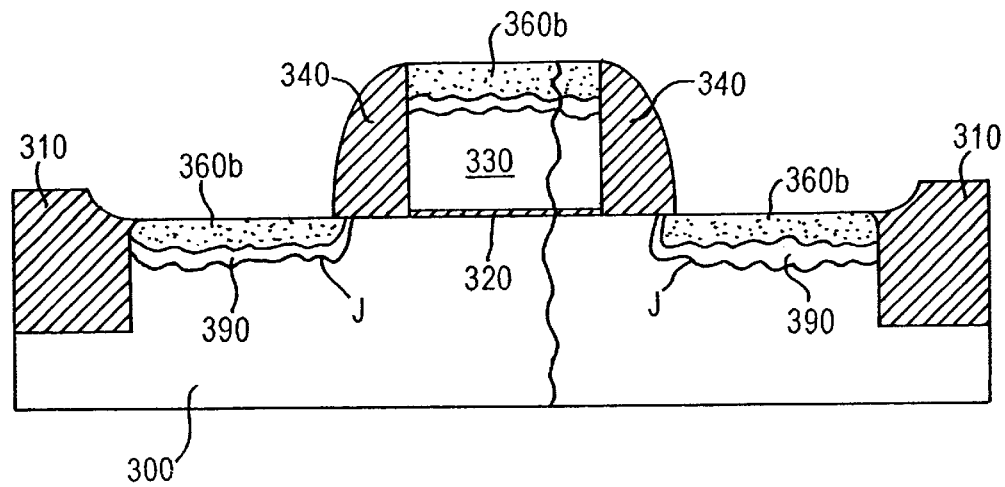

In another embodiment of the present invention, as shown in FIGS. 4A–4B, doped films 400, 401 are formed, as described above, on cobalt layer 350, then the low-temperature RTA step is performed in an environment saturated with species S to form high resistivity cobalt silicide layer 360a and to diffuse impurities from doped films 400, 401 into or through cobalt silicide layer 360a (see FIG. 4A). Alternatively, the low-temperature RTA can be performed in an inert gas atmosphere under pressure, as described above. The high-temperature RTA is then performed to form low resistivity cobalt silicide layer 360b and source/drain regions 390 and junctions J self-aligned to the bottom of cobalt silicide layer 360b (see FIG. 4B). This embodiment enables formation of self-aligned junctions J without adding an additional heating step to the silicidation process.

Figure 5A:
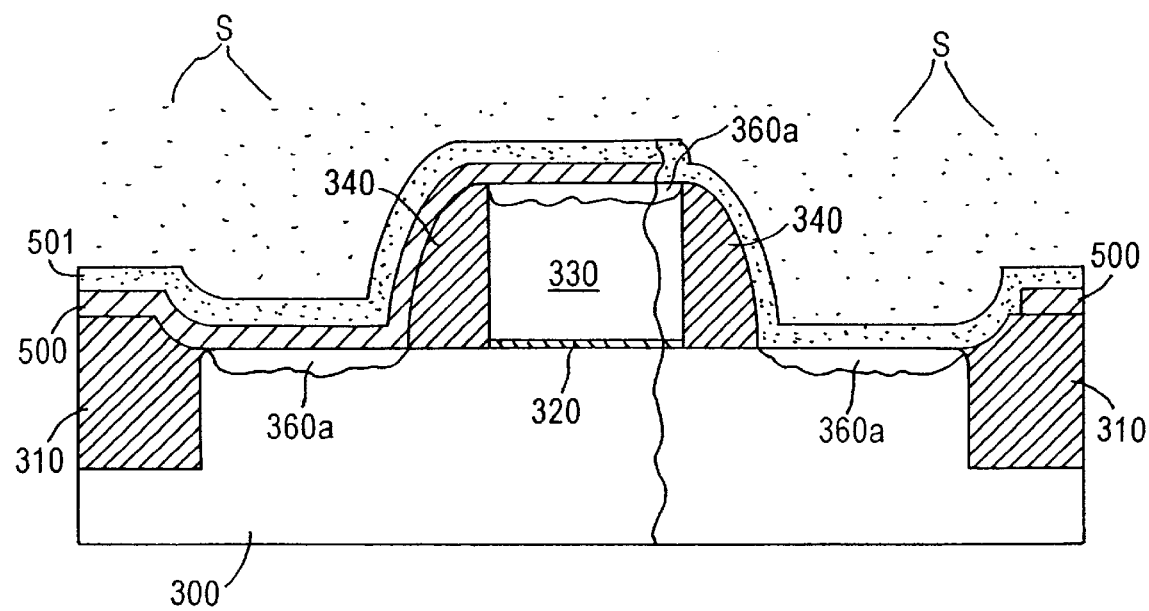
FIGS. 5A–5B schematically illustrate sequential phases of a method in accordance with a further embodiment of the present invention.
Figure 5B:
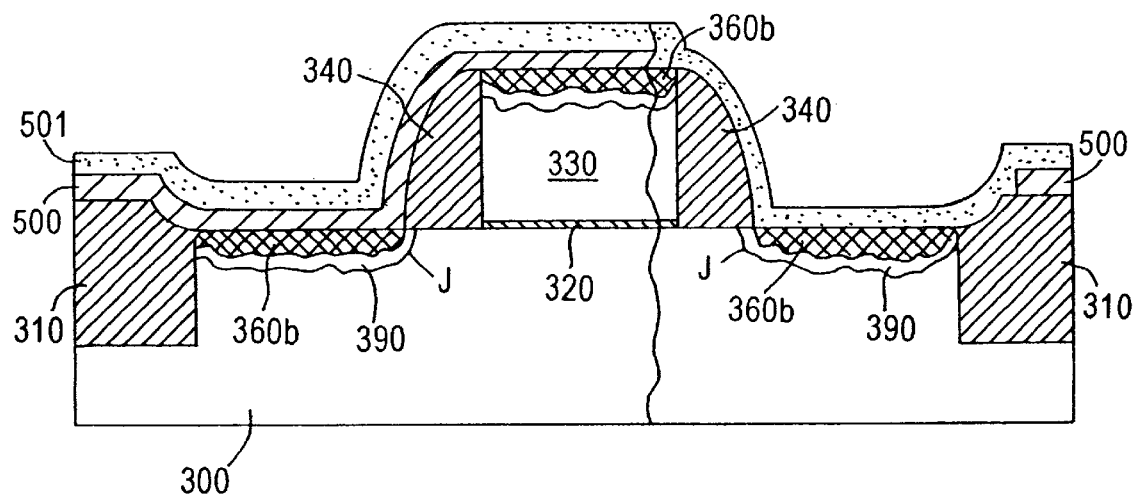

In another embodiment of the present invention, depicted in FIGS. 5A–5B, doped films 500, 501 are formed on high resistivity cobalt silicide layer 360a (see FIG. 5A), then the high-temperature RTA step is performed in an environment saturated with species S to form low resistivity cobalt silicide layer 360b and to diffuse impurities from doped films 500, 501 through cobalt silicide layer 360b to form source/drain regions 390 and junctions J self-aligned to the bottom of cobalt silicide layer 360b (see FIG. 5B). Alternatively, the low-temperature RTA can be performed in an inert gas atmosphere under pressure, as described above. This embodiment enables formation of self-aligned junctions J without adding an additional heating step to the silicidation process.

Figure 6A:
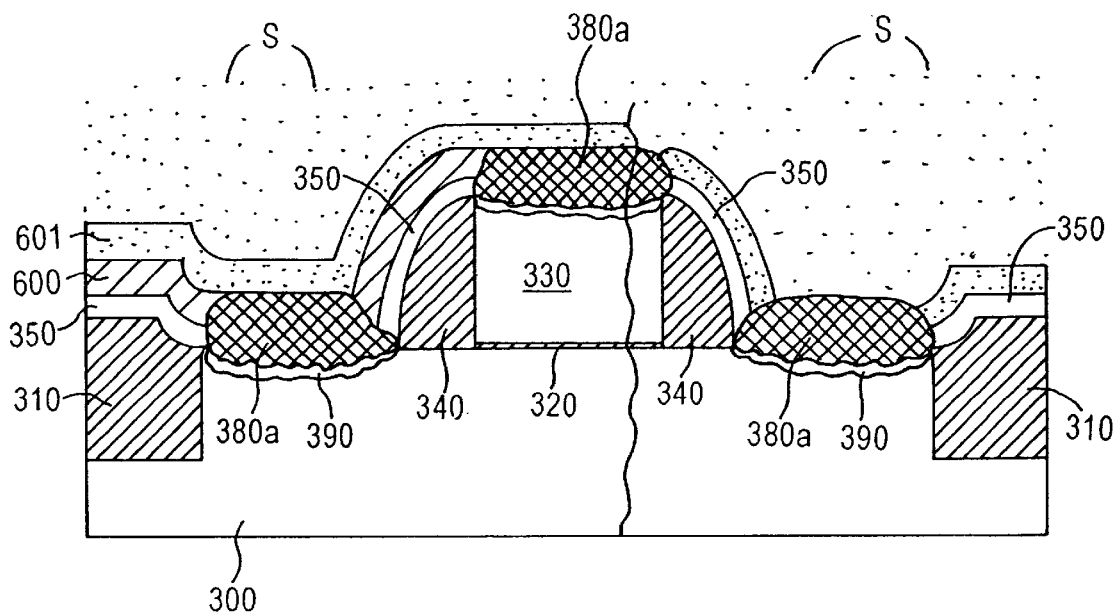
FIGS. 6A–6B schematically illustrate sequential phases of a method in accordance with still another embodiment of the present invention.
Figure 6B:
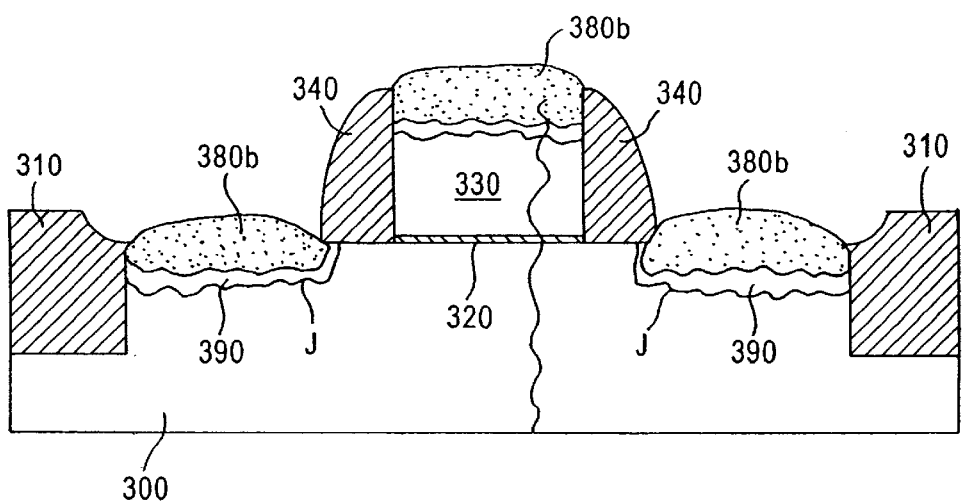

In still another embodiment of the present invention, depicted in FIGS. 6A–6B, doped amorphous silicon films 600, 601 are deposited on cobalt layer 350, then the low-temperature RTA step is performed in an environment saturated with species S to consume amorphous silicon films 600, 601, form high resistivity cobalt silicide layer 380a and diffuse impurities from amorphous silicon films 600, 601 through cobalt silicide layer 380a to form source/drain regions 390 (see FIG. 6A). Alternatively, the low-temperature RTA can be performed in an inert gas atmosphere under pressure, as described above. The high-temperature RTA is then performed to form low resistivity cobalt silicide layer 380b and junctions J self-aligned to the bottom of cobalt silicide layer 380b (see FIG. 6B). The consumption of amorphous silicon films 600, 601 during silicidation results in less consumption of silicon of substrate 300, enabling the formation of ultra-shallow source/drain junctions J.

The methodology of the present invention enables utilization of the methodologies of U.S. Pat. No. 6,096,599 and copending U.S. patent applications Ser. No. 09/187,427 and Ser. No. 09/318,824 to form shallow source/drain regions having ultra-shallow junctions of high integrity, with cobalt silicide contacts of optimized thickness thereon, by diffusing impurities from a doped layer into the substrate during or after silicidation without diffusion of the impurities out of the doped film away from the substrate and into the ambient. The present invention enables formation of cobalt silicide which is sufficiently spaced apart from the source/drain junctions to avoid junction leakage, regardless of the shape of the cobalt silicide/silicon interface or the thickness of the cobalt silicide layer, while ensuring the formation of adequately doped source/drain regions by avoiding unwanted out-diffusion of impurities into the environment. Thus, the present methodology facilitates device scaling by enabling the formation of low-resistivity, properly doped, silicided source/drain regions having ultra-shallow junctions without silicide-related junction leakage. The present invention is applicable to the manufacture of various types of semiconductor devices having silicided source/drain regions, particularly high density semiconductor devices having a design rule of about 0.18 $\mu$ and under.

The present invention can be practiced by employing conventional materials, methodology and equipment. Accordingly, the details of such materials, equipment and methodology are not set forth herein in detail. In the previous descriptions, numerous specific details are set forth, such as specific materials, structures, chemicals, processes, etc., in order to provide a thorough understanding of the present invention. However, it should be recognized that the present invention can be practiced without resorting to the details specifically set forth. In other instances, well known processing structures have not been described in detail, in order not to unnecessarily obscure the present invention.

Only the preferred embodiment of the present invention and but a few examples of its versatility are shown and described in the present disclosure. It is to be understood that the present invention is capable of use in various other combinations and environments and is capable of changes or modifications within the scope of the inventive concept as expressed herein.

What is claimed is:

1. A method of manufacturing a semiconductor device, which method comprises:

forming a metal layer on a main surface of a semiconductor substrate containing silicon;

heating to form a layer of metal silicide;

forming a doped layer having impurities on the metal layer or the metal silicide layer; and heating to diffuse the impurities into the substrate to form source/drain regions having a junction depth below the metal silicide layer, in an environment that substantially prevents out-diffusion of the impurities from the doped layer to the environment.

2. The method according to claim 1, comprising heating in an environment saturated with a species of the impurities.

3. The method according to claim 2, wherein the species comprises phosphene, boron fluoride, indium, antimony or arsene.

4. The method according to claim 1, comprising heating in an environment comprising an inert gas atmosphere maintained at a pressure of about 770 Torr.

5. The method according to claim 4, comprising heating an inert gas atmosphere comprising nitrogen or argon.

6. The method according to claim 1, wherein the metal silicide layer has an irregular interface with the substrate and the source/drain junctions are substantially equidistant from the irregular interface.

7. The method according to claim 1, comprising:

heating at a first temperature to form a first-phase metal silicide layer;

depositing the doped layer on the first-phase metal silicide layer; and heating in the environment at a second temperature greater than the first temperature to:

convert the first-phase metal silicide layer to a second-phase metal silicide layer having a resistivity lower than that of the first-phase metal silicide layer; and diffuse the impurities into the substrate to form the source/drain regions.

8. The method according to claim 1, comprising:

heating to a first temperature to form a first-phase metal silicide layer;

heating at a second temperature greater than the first temperature to convert the first-phase metal silicide layer to a second-phase metal silicide layer having a resistivity lower than that of the first-phase metal silicide layer;

depositing the doped layer on the second-phase metal silicide layer; and heating at a third temperature in the environment to diffuse the impurities into the substrate to form the source/drain regions.

9. The method according to claim 8, wherein the metal layer comprises cobalt, the first-phase metal silicide comprises cobalt silicide and the second-phase metal silicide comprises cobalt silicide.

10. The method according to claim 9, comprising:

heating at the first temperature by rapid thermal annealing at about 400° C. to about 600° C.; and heating at the second temperature by rapid thermal annealing at about 700° C. to about 900° C.

11. The method according to claim 8, comprising heating at the third temperature to diffuse the impurities at about 850° C. to about 950° C. for about 10 seconds to about 60 seconds.

12. The method according to claim 8, wherein the doped layer comprises silicon dioxide, silicon oxynitride or silicon nitride.

13. The method according to claim 6, wherein the source/drain junctions have a depth of about 2000 Å or less.

14. The method according to claim 13, wherein the source/drain junctions have a depth of about 500 Å or less.

15. The method according to claim 1, comprising forming the doped layer with an impurity concentration of about $1 \times 10^{21}$ cm$^{-3}$ to about $2 \times 10^{21}$ cm$^{-3}$.

16. The method according to claim 1, comprising forming the doped layer by:

forming a first doped film comprising a first conductivity type of impurity;

providing a mask on the first doped film, the mask having openings to expose portions of the first doped film;

etching the exposed portions of the first doped film to form through-holes in the first doped film; and forming a second doped film comprising a second conductivity type of impurity on the first doped film and in the through-holes;

wherein the second conductivity type of impurity does not substantially diffuse through the first doped film during heating to diffuse the impurities into the substrate.

17. The method according to claim 16, wherein the environment is saturated with a species of the second conductivity type of impurity.

18. The method according to claim 8, comprising:

forming conductive gates and dielectric field oxide regions on the main surface;

forming dielectric spacers on side surfaces of the gates;

forming the metal layer on the field oxide regions, spacers, and top surfaces of the gates; and etching to remove the metal layer from the field oxide regions and the spacers after forming the first-phase metal silicide layer.

19. The method according to claim 1, comprising:

depositing the doped layer on the metal layer;

heating in the environment at a first temperature to form a first-phase metal silicide layer and to diffuse the impurities into the first-phase metal silicide layer; and heating at a second temperature greater than the first temperature to:

convert the first-phase metal silicide layer to a second-phase metal silicide layer having a resistivity lower than that of the first-phase metal silicide layer; and diffuse the impurities into the substrate to form the source/drain regions.

20. The method according to claim 19, wherein the doped layer comprises an amorphous silicon film, the method further comprising heating at the first temperature to substantially consume the amorphous silicon film.

* * * * *